United States Patent [19]
Bauser et al.

[11] Patent Number: 5,376,876
[45] Date of Patent: Dec. 27, 1994

[54] PHASE WINDING DETECTOR AND ALTERNATOR CHARGING SYSTEM

[75] Inventors: Philippe B. Bauser, Ornex, France; Arthur J. Edwards, Hoffman Estates, Ill.

[73] Assignee: Motorola, Inc., Schaumburg, Ill.

[21] Appl. No.: 175,479

[22] Filed: Dec. 29, 1993

Related U.S. Application Data

[63] Continuation of Ser. No. 904,284, Jun. 25, 1992, abandoned.

[51] Int. Cl.$^5$ .............................................. H02P 9/00
[52] U.S. Cl. .............................................. 322/28; 322/29
[58] Field of Search ............... 322/28, 29, 32; 320/64, 320/68; 318/798, 799, 809; 324/158 MG

[56] References Cited

U.S. PATENT DOCUMENTS

| | | | |
|---|---|---|---|
| 3,138,751 | 6/1964 | Brewster | 320/68 |
| 3,365,646 | 1/1968 | Brewster | 320/64 |
| 3,673,489 | 5/1972 | Riff | 322/28 |
| 4,222,008 | 9/1980 | Mezrich | 328/28 |
| 4,399,397 | 8/1983 | Kleinschmidt, Jr. | 322/29 X |
| 4,409,539 | 10/1983 | Nordbrock et al. | 322/28 |
| 4,486,702 | 12/1984 | Edwards | 322/28 |
| 4,660,519 | 4/1987 | Stocker | 123/339 |
| 4,812,730 | 3/1989 | Nakagawa et al. | 318/732 |
| 4,845,382 | 7/1989 | Eouzan et al. | 307/353 |
| 4,870,339 | 9/1989 | Furukawa et al. | 322/29 |
| 4,980,629 | 12/1990 | Bando et al. | 318/799 |
| 5,182,511 | 1/1993 | Pierret et al. | 324/158 MG |

FOREIGN PATENT DOCUMENTS

| | | |
|---|---|---|
| 0053103A1 | 6/1982 | European Pat. Off. . |
| 0191571A1 | 8/1986 | European Pat. Off. . |
| 0430208A3 | 6/1991 | European Pat. Off. . |
| 0510527 | 10/1992 | European Pat. Off. . |
| 2243962A | 11/1991 | United Kingdom . |

OTHER PUBLICATIONS

Patent Abstracts of Japan vol. 013, No. 280 (E-779) 27 Jun. 1989 & JP-A-10 65 926 (NEC IC Microcomput System Ltd) 13 Mar. 1989 Abstract.

*Primary Examiner*—Kristine L. Peckman
*Attorney, Agent, or Firm*—Phillip H. Melamed

[57] ABSTRACT

A phase winding detector (50) is preferably used to detect alternator (11) rotation in an alternator charging system (10). The detector (50) receives a single winding phase output signal (at 39) and utilizes a sampling apparatus (71, 74, 76) to provide a sampled phase output signal (at 75). A comparison circuit (70) provides an output by comparing the phase output signal with the sampled phase output signal, whereby a detection of variation in the phase output signal is provided (at terminals 85, 87 and 51). After initial detection of variation of the phase winding output signal, preferably additional circuitry (77, 79, 83) results in comparing the phase winding signal with a fixed reference threshold ($V_{ref}$). Detection of a phase winding output signal is implemented without use of a substantial DC blocking capacitor and is implemented by monitoring only one input signal terminal.

20 Claims, 3 Drawing Sheets

PHASE WINDING DETECTOR AND ALTERNATOR CHARGING SYSTEM

This is a continuation of application Ser. No. 07/904,284, filed Jun. 25, 1992 and now abandoned.

FIELD OF THE INVENTION

The present invention relates to phase winding detectors which detect an electrical signal output of a phase winding. Preferably, such phase winding detectors are used to detect alternator rotation and preferably they are used in an alternator charging system.

BACKGROUND OF THE INVENTION

Phase winding detectors are known in which an AC output signal of the phase winding is detected by the use of a rectifying diode. However, such detectors are not suitable for detecting very low magnitude AC output signals since the AC signal generally must exceed the diode bias threshold in order to achieve detection. In addition, such detectors may have to be used with a DC blocking capacitor of substantial magnitude if the AC signal is superimposed on a DC bias, particularly if the DC bias may vary over time.

Some alternator charging systems detect when the alternator is rotating by monitoring the magnitude of a single output phase winding of the alternator. Since the alternator output may be superimposed on a DC bias, a DC blocking capacitor is utilized to implement detection of small magnitude phase winding signals during start up conditions during which field current excitation for the alternator has not yet been provided. The output of the phase winding detection is then utilized, in some alternator charging systems, to control the switching of operative power to a charging system voltage regulator which will then in turn provide field coil excitation. Since it is necessary to detect the output of an alternator phase winding prior to the application of field coil excitation, it is necessary that the phase winding detector be able to monitor and detect very low magnitude signals. This essentially precludes the use of a detection diode. Also, since preferably it is desirable to utilize as few components as possible, outside of a voltage regulator provided as an integrated circuit (IC), typically it is not desirable to use a large DC blocking capacitor for implementing the function of detecting the output of the alternator. Some prior alternator charging systems have proposed monitoring two phase winding outputs of the alternator and essentially comparing them to arrive at a phase winding detection output without the use of a DC blocking capacitor. However, such systems generally require substantial additional circuitry in addition to the voltage regulator IC or they require connecting each of the two phase windings to a separate input pin of the voltage regulator. The providing of an additional input pin to an integrated circuit voltage regulator is also undesirable.

What is needed is an improved phase winding detector that can be used for detecting alternator rotation. This detector should be able to monitor and detect the output of a single phase winding of the alternator without the use of a large magnitude DC blocking capacitor. The detector should also have the ability to detect very low magnitudes of phase winding output signals and therefore implement such detection without the use of a rectifier diode for rectifying the output of the phase winding.

Phase winding detectors for alternator rotation detection can be used in alternator charging systems in which typically the voltage coupled to the voltage regulator through a charging lamp is normally utilized to control the application of battery power to the voltage regulator. The voltage regulator in such systems also typically will control the drive excitation for the charging indicator lamp such that upon detection of a significant output from the alternator windings, drive excitation through the lamp is halted and the lamp is therefore turned off. In such systems, there is a substantial problem if the lamp is burned out and therefore cannot supply a switching signal to the regulator to indicate that battery power should be applied to the regulator to enable it to supply field coil excitation. Battery power is not always applied to the regulator to generate field coil excitation so as to minimize battery current drain. In such systems, some form of alternator rotation detector is utilized to control the application of battery power to the regulator in response to detecting at least a very low level output of the alternator windings which indicates that the alternator is rotating. However, as noted above, preferably such an alternator rotation detector should have no rectifier diode so that it will be able to sense very low magnitudes of the alternator output phase winding. Also, the detector should function without the use of a large magnitude DC blocking capacitor which therefore cannot be provided as part of an integrated circuit voltage regulator. In addition, the detection of alternator rotation should be implemented by providing no more than one phase winding monitoring input to detection circuitry which is provided as part of a voltage regulator integrated circuit.

SUMMARY OF THE INVENTION

In an embodiment of the present invention, a phase winding detector is provided. The detector comprises: means for receiving a single phase output signal provided by a phase winding, said phase output signal having a magnitude; means for periodically sampling the magnitude of said phase output signal; and means for comparing said phase output signal with said sampled phase output signal and providing an output when said phase output signal differs from said sampled phase output signal by a predetermined amount, whereby the detection of variation in said phase output signal is provided.

Preferably, the phase winding detector described above is utilized to detect alternator rotation by detection variations in the output of an alternator phase winding. In addition, preferably an alternator charging system utilizing such an alternator rotation detector is provided. In such detectors and systems, preferably circuitry is provided which may alter the level from which the phase output signal must differ in order to provide an output detection.

BRIEF DESCRIPTION OF THE DRAWINGS

The present invention can be better understood by reference to the drawings in which.

DESCRIPTION OF THE PREFERRED EMBODIMENTS

Figure 1:
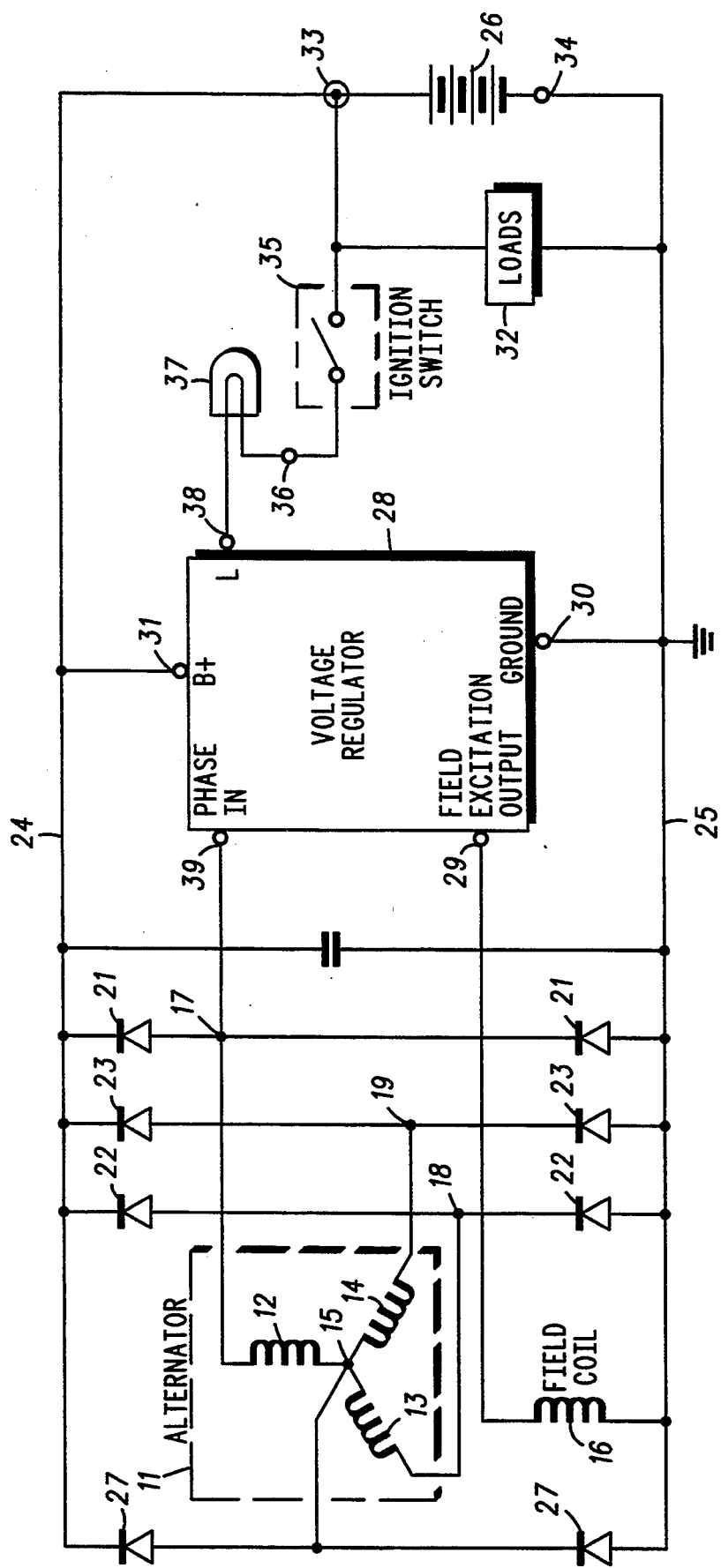
FIG. 1 is a schematic diagram of an alternator charging system having a voltage regulator.

Referring to FIG. 1, an alternator charging system 10 is illustrated which includes an alternator 11 comprising three alternator output phase windings (coils) 12 through 14 arranged in a Y type configuration and having a central neutral point 15. The alternator 11 also includes a field coil winding 16. Each of the alternator output windings 12 through 14 has an end portion at which an electrical signal output is provided corresponding to terminals 17 through 19, respectively. Pairs of rectifying diodes 21 through 23 are connected between the terminals 17-19 and a positive B+ line 24 and a ground potential line 25, respectively. A battery 26 has a positive terminal connected to the B+ line 24 and a negative terminal connected to the ground line 25.

A pair of rectifying diodes 27 is also connected between the B+ line 24 and ground line 25, and this pair has an interim point connected to the neutral point 15. The diodes 27 provide rectification of any AC signal that may be provided at the neutral point 15 due to alternator operation. A voltage regulator 28 is shown in FIG. 1 and provides an output at a terminal 29 that is connected to the field coil 16 for providing field coil excitation thereto. The regulator 28 is also connected to ground potential by virtue of a terminal 30 connected to the ground line 25, and the regulator receives operative power by virtue of the connection of a regulator terminal 31 directly to the B+ line 24.

Essentially, the voltage regulator 28, like all alternator voltage regulators, will monitor the output of the alternator in some fashion and provide suitable field coil excitation at the terminal 29 to maintain the alternator output at a desired level. The pairs of rectifying diodes 21 through 23 and 27 will rectify the AC output of the output windings 12 through 14 and produce a rectified DC charging signal which will maintain the battery 26 at a charged up level. This operation, as described above, is conventional.

In addition, the charging system 10 includes various loads 32 which are connected across the positive and negative terminals of the battery 26. The positive terminal of the battery 26 is connected to a terminal 33 which corresponds to the B+ line 24 while the negative terminal of the battery 26 is connected to a terminal 34 which corresponds to the ground line 25 and which is connected to ground potential. The alternator charging system 10 is contemplated as being a vehicle alternator charging system for a battery located in the vehicle. Therefore, an ignition switch 35 is provided which, in accordance with the position of an ignition keys will selectively implement a connection between the terminal 33 and a terminal 36. A vehicle charging indicator lamp 37 is connected between the terminal 35 and a lamp input terminal L of the voltage regulator 28 wherein the lamp terminal L is also identified by the reference numeral 38. In addition, the voltage regulator has a phase input terminal 39 which is directly connected to the terminal 17 at which an electrical output signal having a magnitude is provided wherein this signal represents the output of a single phase winding corresponding to the winding 12. The signal at terminal 39 is an AC output signal which is created by the winding 12 due to alternator rotation inducing a signal in the winding 12.

In operation, prior to the closing of the ignition switch 35, the terminal 36 is not connected to the terminal 33 and the lamp 37 is off. At this time, only a few components within the voltage regulator 28 will actually receive operative power by virtue of being directly connected to the B+ terminal 31 of the voltage regulator. In response to the closing of the ignition switch 35, battery potential is applied to the terminal 36 and is coupled through the lamp 37 to apply a positive potential at the terminal 38. Prior to any rotation of the alternator 11, this will result in having the lamp 37 turn on because the voltage regulator 28 will provide a lamp drive path between the terminals 38 and 30 to turn on the lamp 37. When a vehicle engine is started, the alternator 11 will then rotate and an output will be provided by the alternator winding 12. Within the voltage regulator 28 an alternator rotation detector will monitor the output of the phase winding 12. When a sufficient output of the alternator is detected, the voltage regulator will interrupt the lamp drive circuitry between the terminals 38 and 30 so as to turn the lamp 37 off.

In prior charging systems, the voltage at the lamp input terminal 38 of the regulator was also used to switch operative battery power to major portions of the voltage regulator 28 such that the regulator can provide field coil excitation at its output terminal 29. However, if the lamp 37 is burned out or missing, the signal at the terminal 38 was lacking and therefore the voltage regulator 28 in prior systems might not have been able to implement the providing of field coil excitation at its output terminal. To prevent such an occurrence, some prior charging systems implemented within the regulator 28 an alternator rotation detector. However, these prior alternator rotation detectors operated by monitoring the outputs of two different alternator phase windings. Thus, two phase monitoring input pins were required for regulators in such prior systems. The prior charging systems monitored two phase winding outputs because they did not want to utilize a large DC blocking capacitor which therefore could not be provided within a voltage regulator 28 if the regulator was implemented as a single integrated circuit. However, in doing so the prior systems increased the number of pin inputs required for the voltage regulator which is also an undesirable result. All of this occurred because the voltage regulator needed to monitor the very small output signal magnitude of the alternator which is produced prior to the application of field coil excitation by the voltage regulator. These problems are overcome by circuitry within the present voltage regulator 28 which is more fully described in connection with the subsequent FIGS. 2 and 3.

Figure 2:
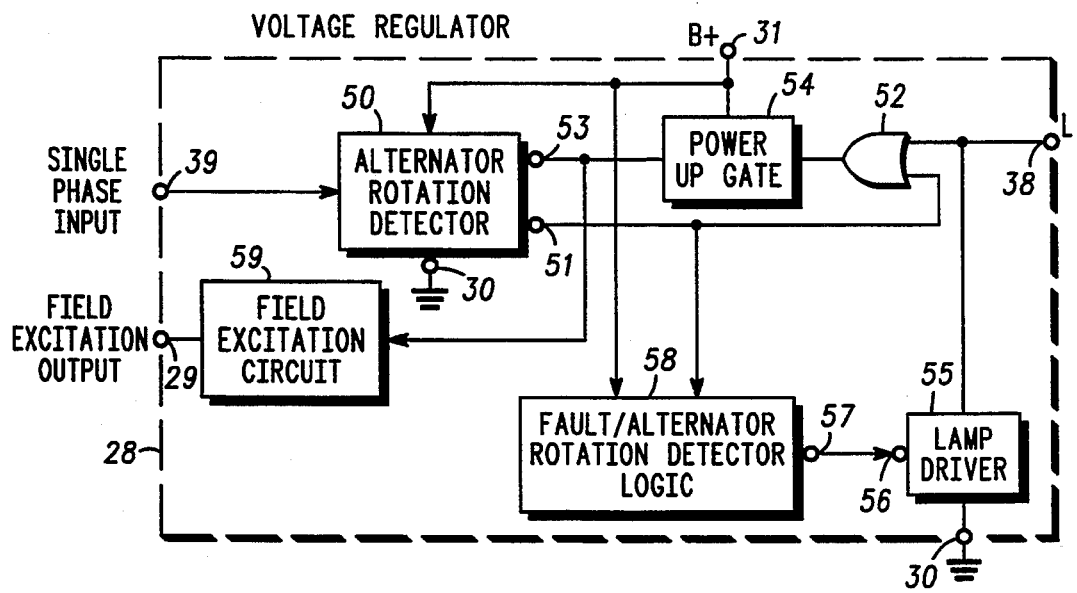
FIG. 2 is a schematic block diagram of the voltage regulator shown in FIG. 1 which includes an alternator rotation detector.

Referring now to FIG. 2, a schematic block diagram of the voltage regulator 28 shown in FIG. 1 is illustrated. Identical reference numerals are utilized in FIGS. 1 through 3 to identify identical corresponding components. In FIG. 2, the single phase input terminal 39 is connected as a sense input to an alternator rotation detector 50 which receives operative power by virtue of a B+ input connection to the terminal 31. The detector 50 is also directly connected to the ground terminal 30 and provides an output at a terminal 51 that is connected as one input to an OR gate 52. The alternator rotation detector 50 receives an input signal at a terminal 53 by virtue of a direct connection between this terminal and the output of a power up gate 54. The gate 54 has a direct connection to the B+ power terminal 31 and receives a control input that is supplied by the output of the OR gate 52.

The lamp terminal 38 is connected as an input to the OR gate 52 and also is directly connected to a lamp driver 55 which is also connected to the ground terminal 30. The operation of the lamp driver 55 is determined by the signal at a lamp driver input terminal 56 that is connected to an output terminal 57 of a fault/alternator rotation detector logic circuit 58. The logic circuit 58 is directly connected to the B+ terminal 31 and also receives an input by virtue of a direct connection to the terminal 51. Circuitry which provides a field coil excitation output signal at the terminal 29 is illustrated in FIG. 2 as being provided by a field excitation circuit 59. The circuit 59 receives operative power by virtue of a power input connection being received from the output of the power up gate 54. The field excitation circuit 59 essentially comprises the rest of the voltage regulator 28 besides the components 50–58 and it provides a field coil excitation output which is directly connected to the terminal 29.

The operation of the alternator charging system 10 shown in FIG. 1 will now be briefly discussed with respect to the operation of the specific voltage regulator components shown in FIG. 2. Essentially, in response to the closing of the ignition switch 35, a high positive signal is provided at the lamp input terminal 38. This signal is passed by the OR gate 52 to the control input of the power up gate 54. In response to this high logic input signal, the gate 54 essentially provides B+ voltage at its output which is then supplied to the terminal 53 of the alternator rotation detector and to the power input terminal Pin of the field excitation circuit 59. Therefore, in response to the lamp 37 being present and the ignition switch 35 being closed, the field excitation circuit 59 will provide field coil excitation at the terminal 29. Prior to the closing of the ignition switch 35, the field excitation circuit 59 would not provide any significant current drain for the battery 26. This is desirable for operation of the alternator charging system 10.

Until rotation of the alternator is detected, the alternator rotation detector 50 will provide a low logic signal at its output terminal 51. The detector logic 58 responds to this low logic signal by providing a high logic signal at its output terminal 57. This results in turning on the lamp driver 55 and thereby providing a direct connection between the terminals 38 and 30. This results in the lamp 37 being turned on. Even though the lamp 37 is turned on, the lamp driver 55 has sufficient resistance such that a sufficient positive voltage is maintained at the terminal 38, with the lamp driver 55 on, to insure a positive input to the OR gate 52 from the lamp terminal 38. If desired, a voltage level shifting circuit can be inserted between terminal 38 and the OR gate 52 to insure this result. When the alternator rotation detector 50 determines that the alternator is turning and providing some output, a high logic state is provided at the terminal 51. Receipt of this high logic state by the logic circuit 58 results in providing a low logic state at the terminal 57 and turning off the lamp driver 55. The end result is that the lamp 37 will now be turned off because proper operation of the alternator has commenced. While not shown in FIG. 2, the detector logic circuit 58 may receive additional input signals which monitor various operational modes of the alternator such that the lamp 37 will be turned on whenever any improper alternator operation or fault is detected. This is conventional and therefore is not shown in FIG. 2.

A significant feature of the alternator charging system 10 is that the output terminal 51 of the alternator rotation detector is connected as an input to the OR gate 52. This means that if for some reason the lamp 37 is not present or is burned out when the ignition switch 35 is closed, a detection of alternator rotation by the detector 50 will result in providing operative power to the field excitation circuit 59 so that field coil excitation will be provided. Thus a failure of the lamp will not necessarily result in a failure of the regulator 28 to provide field coil excitation.

Without field coil excitation being provided, it is known that there is some residual magnetism in the alternator that results in very small magnitudes outputs for the phase windings 12 through 14 when there is alternator rotation. Of course when field coil excitation is provided, there is a substantially larger output by these phase windings. A major feature of the charging system 10 is that only a single phase input has to be monitored by the alternator rotation detector 50 in order to determine alternator rotation when field excitation is not being applied. In detector 50, this can occur without the use of a large DC blocking capacitor and without requiring the voltage from the single phase winding to substantially exceed the turn on voltage of a rectifier diode. Thus the alternator rotation detector 50 has a very high degree of sensitivity and need only monitor a single phase input to properly detect the output of a phase winding. The manner in which this is accomplished is more clearly illustrated in connection with FIG. 3 and the waveforms in FIGS. 4A through 4E.

Figure 3:
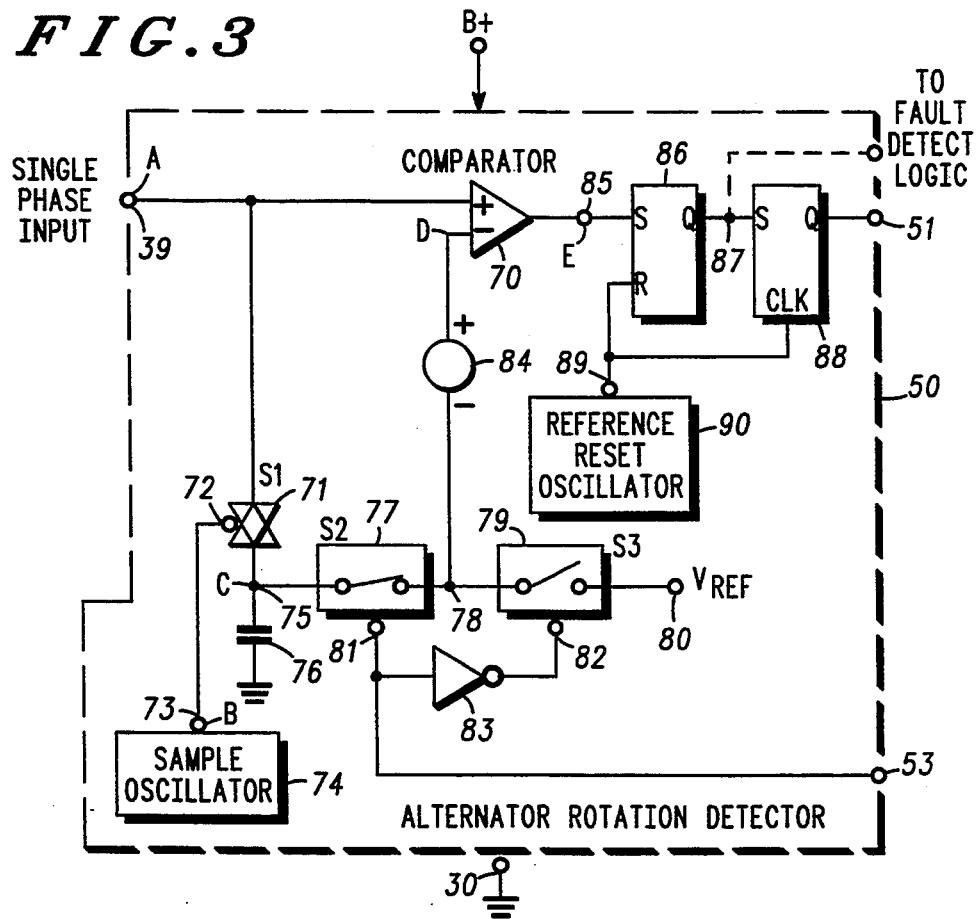
FIG. 3 is a schematic diagram of the alternator rotation detector shown in FIG. 2.

Referring to FIG. 3, a more detailed schematic diagram of the alternator rotation detector 50 is illustrated. The single phase input terminal 39 is connected as an input to a positive input of a comparator 70 and also to a switch $S_1$ indicated by the reference numeral 71. The switch $S_1$ is preferably a bi-directional MOS switch. A control terminal 72 of the switch $S_1$ receives its input by a direct connection to an output terminal 73 of a sample oscillator 74 which essentially just comprises a 1 kilohertz oscillator. The switch $S_1$ is also connected to a terminal 75 which is connected to ground through a small capacitance sampling capacitor 76. The terminal 75 is connected as an input to a switch $S_2$ designated by the reference numeral 77. An output of the switch $S_2$ is provided at a terminal 78 which is connected to an output of a switch $S_3$ designated by the reference numeral 79. The switches $S_2$ and $S_3$ are preferably N-channel MOS switches which are less costly than bi-directional MOS switches but somewhat less accurate. However, the accuracy of the switches $S_2$ and $S_3$ need not be as great as the accuracy of the switch $S_1$. An input side of the switch 79 is connected to a terminal 80 at which a fixed referenced voltage $V_{ref}$ is provided. This reference voltage preferably has a magnitude of +2.0 volts. The switch $S_2$ has a control input terminal 81 that is directly connected to the terminal 53 while the terminal 53 is connected to a control input terminal 82 of the switch $S_3$ through an inverter 83. The end result is that the switches $S_2$ and $S_3$ are operated in complementary fashion wherein the signal at the terminal 53 determines the operative states of the switches $S_2$ and $S_3$.

The terminal 78 is connected to a negative side of a delta voltage source 84 which has its positive side connected to a negative input of the comparator 70. The delta voltage source 84 implements a 150 millivolt offset such that the negative input of the comparator 70 is 150 millivolts above the voltage provided at the terminal 78. The output of the comparator 70 is provided at a terminal 85 which is connected as an input to a set terminal S of a flip flop 86. A Q output terminal of the flip flop 86 is provided at a terminal 87 that is connected to a data input terminal D of a flip flop 88. A Q output terminal of the flip flop 88 is directly connected to the output terminal 51 of the alternator rotation detector 50. A reset terminal R of the flip flop 86 and a clock terminal CK of the flip flop 88 are both directly connected to a terminal 89 at which a reference reset timing signal is provided by a reference reset oscillator 90. The oscillator 90 preferably has a frequency of anywhere from 50 to 100 hertz. Preferably a single high frequency master oscillator and appropriate divide down circuits can be used to implement the sample oscillator 74 and reference reset oscillator 90. The operation of the alternator rotation detector 50 will now be explained in conjunction with the signal waveforms shown in FIGS. 4A through 4E. Alphabetic designations A–E in FIG. 3 indicate where signals having the waveforms shown in FIGS. 4A–4E are provided, respectively.

Upon closure of the ignition switch 35, the alternator 11 will not yet have commenced movement. In such a case, there will be zero magnitude for the signal at the terminal 39. If the lamp 37 is in place and is working properly, closure of the ignition switch 35 results in a high signal at the terminal 38 which will result in closing the power up gate 54 and providing a high logic state at the terminal 53. In such a situation, it is not necessary for the alternator rotation detector 50 to detect a very low magnitude output of the single phase input signal provided at the terminal 39 when the alternator first commences rotation. This is because the existence of the lamp 37 and its proper operation has resulted in closing the power up gate 54 to supply operative power to the field excitation circuit 59 that provides field coil excitation.

In a situation such as discussed in the preceding paragraph, the high logic state at terminal 53 implements operative states for the gates $S_2$ and $S_3$ which are opposite to that shown in FIG. 3. This results in comparing the phase winding input signal provided at the terminal 39 with a reference voltage provided at the negative input of the comparator 70. This reference voltage is equal to the +2.0 volt reference voltage at the terminal 80 plus the 150 millivolt offset provided by the delta voltage generator 84. Whenever the output of the winding 12 at terminal 39 exceeds the voltage at the negative input of the comparator 70, the output of the comparator will go high and set the flip flop 86. This provides a high signal at the terminal 87 which is maintained until the flip flop 86 is reset. Upon the occurrence of an output pulse provided by the reference reset oscillator 90, first the flip flop 88 will be clocked and therefore the high signal at the terminal 87 will be transferred to and maintained as the Q output of the flip flop 88. Then the flip flop 86 will be reset. The bottom line is that the alternator rotation detector 50 in FIG. 3 will provide a high logic output at the terminal 51 if the lamp 37 is functioning properly and the output of the phase winding 12 at terminal 39 exceeds 2.15 volts.

A main feature of the present invention is the operation of the alternator rotation detector 50 when the lamp 37 is burned out or missing. In such a case, closure of the ignition switch 35 does not change the signal at terminal 38. Preferably, no additional component, such as a bypass resistor, is provided in parallel to the lamp 37. Thus initially, prior to alternator rotation, a low logic signal is provided at the terminal 53 and the power up gate 54 is not automatically closed to provide power for generating the field coil excitation output. During this condition, and in response to the low signal at the terminal 53, the switches $S_2$ and $S_3$ will be as shown in FIG. 3. In this "start up" mode, the alternator rotation detector 50 will be able to detect very small magnitudes of the single phase input signal provided at the terminal 39. In response to such a detection, which indicates rotation of the alternator 11, a high logic state will be provided at the terminal 51. However, now this logic high state, via the OR gate 52, will result in closing the power up gate 54 and providing operative power to the field excitation circuit 59 so as to provide proper field coil excitation. This occurs in the following manner.

Figure 4A:
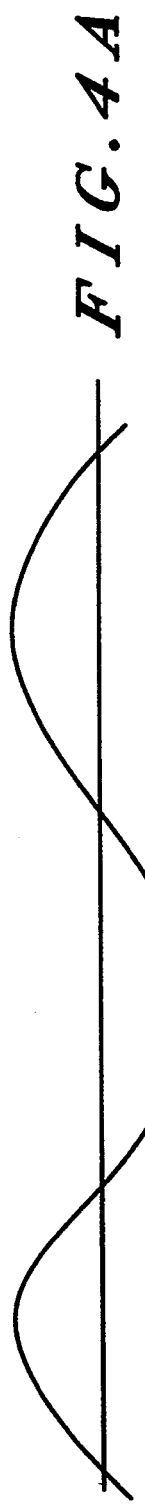
FIGS. 4A through 4E comprise graphs of electrical signals representative of the operation of the apparatus shown in FIGS. 1-3.
Figure 4B:
Figure 4C:

With a low logic state at the terminal 53 and the switches $S_2$ and $S_3$ in their operative states as shown in FIG. 3, for every pulse of the sample oscillator 74, the gate $S_1$ will be closed for the duration of such pulses. These pulses occur every one millisecond and have a duration of approximately 10 microseconds. These pulses are shown by the signal waveform illustrated in FIG. 4B. For each of these pulses, the capacitor 76 will essentially charge up to a voltage determined by the magnitude of the single phase input signal provided at the terminal 39. FIG. 4A illustrates the waveform of such a single phase input signal and FIG. 4C illustrates the waveform of the capacitor voltage provided at the terminal 75. The end result is that the magnitude of the phase winding signal at the terminal 39 will be periodically sampled to produce a sampled phase winding output signal at the terminal 75 corresponding to the signal waveform shown in FIG. 4C.

Figure 4D:
Figure 4E:
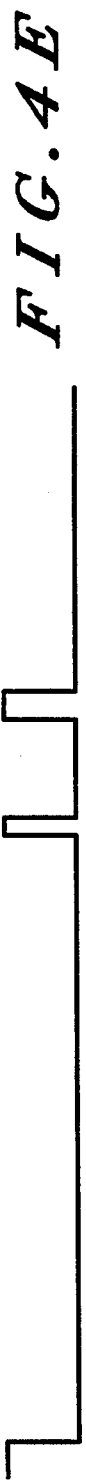

Since the gate 77 is closed, this results in the same signal at terminal 75 being provided at the terminal 78. The signal at terminal 78, after being offset by 150 millivolts due to the delta voltage source 84, results in the negative input to the comparator 70 representing a signal waveform corresponding to the signal shown in FIG. 4D. It should be noted that the waveform in FIG. 4D comprises the waveform in FIG. 4C but just offset by +150 millivolts. In FIG. 4D, the magnitude of the single phase input signal shown in FIG. 4A is superimposed, in dashed form, on the same time axis. This provides a better visualization of how the comparator 70 will respond to the signals provided at its positive and negative inputs. The output of the comparator 70 is provided at the terminal 85 and this corresponds to a signal having the waveform shown in FIG. 4E.

In accordance with the above explanation, it can be seen that the alternator rotation detector 50 has essentially implemented a high frequency sampling of the single phase alternator input signal provided at the terminal 39. This single phase input signal is essentially compared with a sampled version of itself, offset by 150 millivolts, by the comparator 70 which then produces a positive output that indicates when the signal at the terminal 39 exceeds the signal at the negative input of the comparator 70. This will happen when the single phase input signal at the terminal 39 is changing and therefore indicative of the fact that the alternator is rotating and the phase winding 12 is providing some output.

A detection of the output of the phase winding 12 is achieved without providing a DC blocking capacitor.

Any DC level at the terminal 39 would also be provided at the terminal 75 due to the high frequency sampling of the signal at the terminal 39. Thus the comparator 70 eliminates the effect of any such DC level. The magnitude of the capacitor 76 for such a high frequency sampling is relatively small such that this capacitor can be implemented as part of an integrated circuit. Preferably the voltage regulator 28 is provided as an integrated circuit. Only a single phase input signal had to monitored in order to achieve the desirable operation of the alternator rotation detector 50. This means that only a single phase input pin had to be provided for the voltage regulator 28. This combination of advantages is not believed to be achieved by prior alternator rotation detectors.

Once the alternator rotation detector 50 detects alternator rotation, a high logic signal will be provided at the terminal 51. This, via the OR gate 52, will result in closing the power up gate 54 and providing operative power so as to generate the proper field coil excitation at the terminal 29. The closing of the power up gate 54 also changes the logic state at the terminal 53 of the alternator rotation detector. This means that now the operative states of the switches S2 and S3 will be altered in complementary fashion to achieve the oppositive states shown in FIG. 3. When this occurs, the comparator 70 will no longer compare the single phase inputs signal at the terminal 39 with a sampled version of itself, but will now compare this signal to a fixed reference level of 2.15 volts. This is desired because now the alternator rotation detector is to be used as part of a fault detection apparatus. This is because during normal operation of the alternator with field coil excitation being provided, the output of the phase winding 12 should be in excess of 2.15 volts. Therefore, if the signal at the terminal 51 reverts to a low state this is indicative of improper operation of the alternator. In such a case, this should result in an indication of such improper operation and the cutting off of power to the field coil since the field coil and alternator are not properly operating. The alternator charging system 10 shown in FIG. 1, in conjunction with the circuits shown in FIGS. 2 and 3, will implement such a function.

While we have shown and described specific embodiments of the present invention, further modifications and improvements will occur to those skilled in the art. One such modification could be providing the signal at the terminal 87 as the fault/alternator rotation logic input to the detector logic circuit 58 instead of utilizing the signal at the terminal 51. This possibility is indicated in dashed form in FIG. 3 and actually represents a preferred circuit connection. In addition, various aspects of the present invention could also be utilized for detecting very low output signals provided by any phase winding, such as the output of a reluctance sensor. The circuitry described herein is useful when it is desired to have only a single input pin for a detector, when the sensitivity of detection muse be very high such that use of a detector rectifying diode is not suitable, and/or when it is desired not to utilize a high value DC blocking capacitor for cost or other design considerations. All modifications to the circuits and systems disclosed herein which retain the basic underlying principles claimed herein are within the scope of this invention.

We claim:

1. A phase winding detector comprising:

means for receiving a single phase output signal provided by a phase winding, said phase output signal having a magnitude;

means for periodically sampling, in accordance with oscillator pulses, the magnitude of said phase output signal and providing a sampled phase output signal in response thereto; and means for comparing said phase output signal with said sampled phase output signal and providing an output when said phase output signal differs from said sampled phase output signal by a predetermined amount, whereby detection of variation in said phase output signal is provided.

2. A detector according to claim 1 wherein said sampling means comprises a sampling capacitor coupled to said receiving means via a controllable gate operated in accordance with received sampling pulses.

3. A detector according to claim 2 wherein said sampled phase output signal is provided at one terminal of said capacitor, said one terminal coupled to one input of a comparator, forming part of said comparison means, said comparator having another input coupled to said receiving means.

4. A detector according to claim 3 wherein said capacitor terminal is selectively coupled to said one comparator input through a controllable second gate, and wherein a controllable third gate selectively couples a reference voltage to said one comparator input, said second and third gates being operated in complementary fashion for alternately coupling said capacitor terminal and said reference voltage to said one comparator input.

5. An alternator rotation detector comprising:

means for receiving a single phase AC output signal provided by an alternator phase winding, said phase output signal having a magnitude;

means for periodically sampling, in accordance with oscillator pulses, the magnitude of said alternator phase output signal and providing a sampled phase output signal in response thereto; and means for comparing said alternator phase output signal with said sampled phase output signal and providing an output when said alternator phase output signal differs from said sampled phase output signal by a predetermined amount, whereby detection of variation in said alternator phase output signal, and thereby detection of alternator rotation, is provided.

6. A detector according to claim 5 wherein said sampling means comprises a sampling capacitor coupled to said receiving means via a controllable gate operated in accordance with received sampling pulses.

7. A detector according to claim 6 wherein said sampled phase output signal is provided at one terminal of said capacitor, said one terminal coupled to one input of a comparator, forming part of said comparison means, said comparator having another input coupled to said receiving means.

8. A detector according to claim 7 wherein said sampling pulses have a frequency of at least as high as the kilohertz range.

9. A detector according to claim 7 wherein said comparator another input is directly DC coupled to said receiving means.

10. A detector according to claim 9 wherein said capacitor terminal is selectively coupled to said one comparator input through a controllable second gate, and wherein a controllable third gate selectively couples a reference voltage to said one comparator input, said second and third gates being operated in complementary fashion for alternately coupling said capacitor terminal and said reference voltage to said one comparator input.

11. A detector according to claim 10 wherein said detector is implemented as an integrated circuit device which includes said capacitor.

12. An alternator charging system including:
    a voltage regulator; and
    an alternator having at least one output phase winding, said alternator receiving field coil excitation from said voltage regulator,
    said voltage regulator including an alternator rotation detector comprising;
    means for receiving a single phase AC output signal, having a magnitude, from said alternator phase winding,
    means for periodically sampling, in accordance with oscillator pulses, the magnitude of said alternator phase output signal and providing a sampled phase output signal in response thereto, and
    means for comparing said alternator phase output signal with said sampled phase output signal and providing an output when said alternator phase output signal differs from said sampled phase output signal by a predetermined amount, whereby detection of variation in said alternator phase output signal, and thereby detection of alternator rotation, is provided.

13. A system according to claim 12 wherein said sampling means comprises a sampling capacitor coupled to said receiving means via a controllable gate operated in accordance with received sampling pulses.

14. A system according to claim 13 wherein said sampled phase output signal is provided at one terminal of said capacitor, said one terminal coupled to one input of a comparator, forming part of said comparison means, said comparator having another input coupled to said receiving means.

15. A system according to claim 14 wherein said sampling pulses have a frequency of at least as high as the kilohertz range.

16. A system according to claim 14 wherein said comparator another input is directly DC coupled to said receiving means.

17. A system according to claim 16 wherein said capacitor terminal is selectively coupled to said one comparator input through a controllable second gate, and wherein a controllable third gate selectively couples a reference voltage to said one comparator input, said second and third gates being operated in complementary fashion for alternately coupling said capacitor terminal and said reference voltage to said one comparator input.

18. A system according to claim 17 wherein said alternator rotation detector is implemented as an integrated circuit device which includes said capacitor.

19. A system according to claim 13 wherein said detector is implemented as an integrated circuit device which includes said capacitor.

20. A system according to claim 12 wherein said voltage regulator has an input power up circuit which, in response to said comparison means providing an output indicative of variation in said alternator phase output signal, provides operative power to portions of said voltage regulator which provide said field coil excitation to said alternator.

* * * * *